Patent Number: 4,951,115
Date of Patent: Aug. 21, 1990

[54] COMPLEMENTARY TRANSISTOR STRUCTURE AND METHOD FOR MANUFACTURE

[75] Inventors: David L. Harame, Mohegan Lake; Gary L. Patton, Poughkeepsie; Johannes M. C. Stork, Yorktown Heights, all of N.Y.

[73] Assignee: International Business Machines Corp., Armonk, N.Y.

[21] Appl. No.: 319,374

[22] Filed: Mar. 6, 1989

[51] Int. Cl.$^5$ ............................................. H01L 27/02
[52] U.S. Cl. ......................................... 357/44; 357/49; 357/34; 357/90; 357/50
[58] Field of Search ..................... 357/44, 49, 34, 65, 357/90, 50, 91, 59, 88, 89; 437/958, DIG. 157, 97, 95

[56] References Cited

U.S. PATENT DOCUMENTS

| | | | |
|---|---|---|---|
| 3,702,428 | 11/1972 | Schmitz | 357/44 |
| 3,730,786 | 9/1970 | Ghosh | 357/44 |
| 4,136,353 | 1/1979 | Polinsky | 357/90 |
| 4,272,776 | 6/1981 | Weijland et al. | 357/44 |
| 4,274,891 | 6/1981 | Silvestri et al. | |
| 4,339,767 | 7/1982 | Horng et al. | |
| 4,357,622 | 11/1982 | Magdo et al. | |
| 4,425,574 | 1/1984 | Silvestri et al. | |
| 4,485,552 | 12/1984 | Magdo et al. | |

OTHER PUBLICATIONS

T. H. Yeh, "Self-Aligned Integrated NPN (Vertical) and PNP (Lateral) Structures", IBM Tech. Bulletin, 2/80, pp. 4047–4051.

Primary Examiner—Andrew J. James
Assistant Examiner—Don Monin
Attorney, Agent, or Firm—Scully, Scott, Murphy & Presser

[57] ABSTRACT

A complementary bipolar transistor structure having one symmetrical intrinsic region for both the NPN and PNP transistors and a method for fabricating the structure. The transistor structure includes a vertical NPN transistor operating in the upward direction and a vertical PNP transistor operating in a downward direction. In the method, the sub-emitter and the sub-collector regions are formed by depositing a first epitaxial layer of semiconductor material of a first conductivity type on the surface of a semiconductor substrate of a second conductivity type, and forming the sub-collector by etching a shallow trench in the first layer and depositing semiconductor material of a second conductivity type by LTE and planarizing. The intrinsic regions for both of the transistors are formed by depositing a second layer of semiconductor material of the second conductivity type on the surface of the first layer and a third layer of semiconductor material of the first conductivity type on the surface of the second layer by either LTE or MBE. In one embodiment, the second and third layers are provided with a uniform vertical doping profile for one thickness of the layer and a graded doping profile for the remaining thickness in which the minimum doping level for both graded portions is at the junction between the second and third layers. The second layer forms the base and the third layer forms the collector for one transistor while at the same time the second layer forms a collector and the third layer forms the base for the other transistor. The performance of the intrinsic base and collector regions can be further improved by forming the second and third layers with a compound semiconductor material, such as, the compound of Si-Ge to create a heterojunction transistor. Device and intrinsic region isolation is effected by a combination of deep trench and shallow trench processes and reach-through regions for the sub-emitter and sub-collector are formed. A layer of polysilicon is deposited and selectively etched to form an extrinsic collector region for one transistor and extrinsic base regions for the other transistor. A further layer of single crystal silicon is deposited to form the extrinsic base region for one transistor and the emitter for the other transistor.

23 Claims, 4 Drawing Sheets

COMPLEMENTARY TRANSISTOR STRUCTURE AND METHOD FOR MANUFACTURE

BACKGROUND OF THE INVENTION

1. Field of the Invention

This invention is directed to complementary bipolar transistors, and more particularly, to complementary vertical bipolar NPN and PNP transistors having one symmetrical doping profile for the intrinsic region of both transistors.

2. Description of the Prior Art

The fabrication of complementary bipolar transistors on a common substrate has continued to be plagued by two major problems. The first problem results from unequal performance characteristics for the NPN and PNP devices. PNP transistor characteristics are inherently inferior to those of NPN transistors as typified by device speed which is lower for an PNP by a factor of 2–20. As a result, it would be necessary to degrade the performance of the NPN transistor to match the performance of the PNP transistor. A second problem arises in the fabrication of the complementary transistors which typically requires numerous, highly precise fabrication steps. The complicated fabrication process increases costs and reduces device reliability.

One prior art example of a complementary transistor structure and method for manufacture that attempts to solve some of the prior art problems can be found in U.S. Pat. No. 4,357,622 to Magdo et al. assigned to the same assignee as the present invention. In the Magdo et al. patent, the NPN and PNP transistors are independently fabricated and optimized. In particular, the doping profiles for the emitter, base and collector regions of each transistor are separately formed. A significant feature of the Magdo et al. patent is the formation of the P-type emitter for the PNP transistor by forming a polycrystalline silicon layer on the exposed surface of the base prior to the last drive-in treatment. After drive-in, doping ions in the polycrystalline layer are driven into the epitaxial layer forming the base to provide a shallow emitter region. The use of this double silicon process has been found to improve the performance of the PNP transistor thereby partially reducing the difference in device characteristics with the NPN transistor.

The use of the Magdo et al. process, while improving performance still results in unequal NPN and PNP devices. For high performance complementary circuit design, both the PNP and the NPN must be of comparable high performance. The key aspects for developing such a structure include a low sub-collector resistance for both the NPN and PNP type devices; high performance NPN and PNP profiles, including narrow base, as well as a steep emitter profile; planarity of the surface of the device for better wirability; and a limitation in the number of masking steps.

SUMMARY OF THE INVENTION

The present invention provides a complementary bipolar transistor structure fabricated with one symmetrical intrinsic region for both the NPN and the PNP transistors. The present invention utilizes advanced epitaxial techniques, such as molecular beam epitaxy (MBE) and low temperature epitaxy (LTE) by ultra high vacuum chemical vapor deposition (UHV/CVD) to provide the identical vertical profile for the base-collector junction of both the transistors. The use of LTE herein refers to an epitaxy process performed in the range of temperatures between 500°–700° C. with the preferred range being 550°–650° C. The resulting structure includes a vertical NPN transistor operating in the upward direction and a vertical PNP transistor operating in the downward direction. In addition, the inventive method combines a single polycrystalline process for the NPN transistor with a double polycrystalline-like process for the PNP transistor allowing several process steps for both transistors to be combined while also maintaining planarity. Furthermore, the present invention includes the formation of profile gradients in both the upward and downward directions for the intrinsic base and collector regions. Transistor performance can be even further improved by forming the intrinsic base and collector regions with a compound semiconductor, such as Si-Ge. In one embodiment, the Ge is added with a graded profile to reduce the bandgap and increase the speed and gain of the transistors.

In the method, the sub-emitter and the sub-collector regions are formed by depositing a first epitaxial layer of semiconductor material of a first conductivity type on the surface of a semiconductor substrate of a second conductivity type. A sub-collector region of a second conductivity type is formed in the surface of the first layer by etching a shallow trench in the first layer and depositing semiconductor material utilizing a low temperature epitaxial process and planarizing. The portion of the first layer having the first conductivity type forms the sub-emitter of one of the complementary transistors and the region of the second conductivity type in the first layer forms the sub-collector of the other of the complementary transistors.

The intrinsic regions for both of the transistors are formed by depositing a second layer of semiconductor material on the surface of the first layer and a third layer of semiconductor material on the surface of the second layer. The second and third layers are formed by either an LTE or an MBE process. The second layer is in situ doped with dopants of the second conductivity type and the third layer is in situ doped with dopants of the first conductivity type. The vertical doping profile for the second and third layers is precisely controlled and may be provided with gradients to improve transistor performance. In one embodiment, the second and third layers are provided with a uniform vertical doping profile for one thickness of the layer and a graded doping profile for the remaining thickness. In a preferred embodiment, the graded profiles for both the second and third layers have a minimum doping level at the junction between the second and third layers.

The second and third layers form the intrinsic base and collector regions for both of the complementary transistors. In the preferred embodiment, the vertical doping profile is symmetrical about the base collector junction and is essentially identical for both of the transistors. In one embodiment, the second layer forms the base and the third layer forms the collector for an NPN transistor that operates in the upward direction, while at the same time, the second layer forms the collector and the third layer forms the base for a PNP transistor that operates in the downward direction.

As stated above, the performance of the intrinsic base and collector regions can be further improved by forming the second and third layers with a compound semiconductor material. For example, the layers could be formed of a compound of Si-Ge to create a heterojunction transistor. In addition, the Ge content can be graded to reduce the bandgap for increased performance.

Device isolation is effected by utilizing a low temperature deep trench process to separate the NPN transistor from the PNP transistor. In addition, a low temperature shallow trench process is used to isolate the PNP and NPN intrinsic regions and provide space for reach-through contacts. The low temperature deep and shallow trench processes are known to those skilled in the art of semiconductor fabrication.

Thereafter, a fourth layer of semiconductor material of the first conductivity type is deposited on the surface of the third layer and then selectively etched to provide an extrinsic collector region and an emitter reach through region for one of the transistors and simultaneously a pair of extrinsic base regions for the other transistor. The fourth layer is preferably a layer of in-situ-doped polycrystalline semiconductor material deposited at low temperature. A fifth layer of single crystal semiconductor material is deposited by LTE on the assembly and selectively etched to form an extrinsic base region for one of the transistors and a sub-collector reach through region and an emitter region for the other of the transistors. Base contacts are then deposited for both transistors together with an emitter contact for the one transistor and a collector contact for the other transistor.

The complementary bipolar transistor structure of the invention is fabricated with one symmetrical, vertical profile for the intrinsic region of both the NPN and PNP transistors. The regions can then be used simultaneously by a vertical NPN operating in an upward direction and a vertical PNP operating in a downward direction. In addition to the method of the invention resulting in a reduced number of fabrication steps, the inventive structure has a low sub-collector resistance, high performance NPN and PNP profiles, that include a narrow base and a steep emitter profile and an improved planarity of the surface for better wirability.

DETAILED DESCRIPTION OF THE INVENTION

Figure 1:
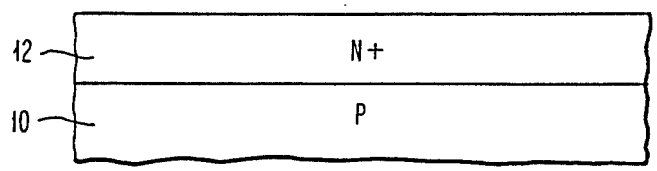
FIGS. 1-8 are cross-sectional views of a pair of complementary transistors at various stages in the fabrication process of the present invention.

Referring now to the drawings, FIGS. 1-8 will be described in connection with the various steps of fabrication of the complementary pair of vertical bipolar transistors on a common semiconductor substrate. FIGS. 1-8 show the use of a P-type semiconductor substrate. It should be understood, however, that the selection of a P-type substrate is illustrative and that the features of the present invention are equally adaptable to the use of N-type semiconductor substrates. It should also be understood that various conventional processes relating to applying, exposing and developing of photo-resist materials to form desired patterns for masking layers are not specifically described herein but are well known in the art. Moreover, the invention contemplates the use of recent advances in epitaxial deposition techniques such as in LTE and MBE that are known and are also not specifically described herein. In addition, the invention is described with silicon being used as the semiconductor material, however, any other suitable semiconductor material may be utilized, such as germanium.

Figure 2:
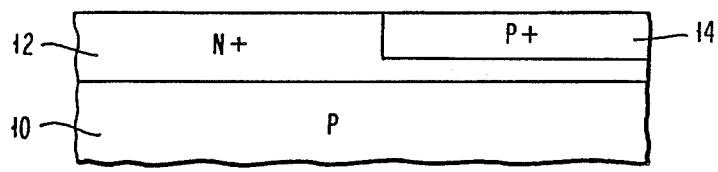

As shown in FIG. 1, a P-type silicon substrate 10 is provided and a heavily doped N+ layer is deposited on the surface of substrate 10 by MBE. Layer 12 is typically deposited to a thickness of 500 to 1,000 nm and both substrate 10 and layer 12 are single crystal. In order to achieve a sufficiently low sheet resistance of the NPN sub-emitter, the thickness of layer 12 can be adjusted for the design of the device. As shown in FIG. 2, a heavily P-doped region 14 is formed within the layer 12. Region 14 may be formed by etching a shallow trench and filling the trench with heavily boron doped silicon by LTE and planarizing the surface. One embodiment of a method for forming the region 14 is shown in FIGS. 9-13 which will be described in more detail below.

The N+ region 12 acts as the sub-emitter for the NPN transistor and the P+ region 14 acts as the sub-collector for the PNP transistor of the complementary pair of transistors to be formed. Optionally, a $\pi$-epitaxial layer of a few hundred nanometers may be grown between layers 10 and 12 to vertically isolate the sub-collector region 14 from the sub-emitter region 12.

Figure 3:
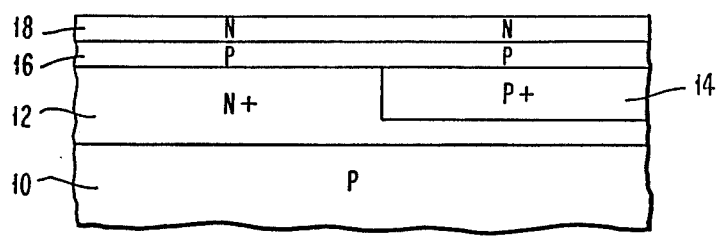

As shown in FIG. 3, the intrinsic vertical profiles for both the NPN and the PNP transistors are formed by depositing a layer 16 of P-doped silicon and a layer 18 of N-doped silicon. Layers 16 and 18 are deposited using either LTE or MBE. The layers are typically deposited to a thickness of about 50-100 nm each.

Layers 16 and 18 form the intrinsic base and collector regions for both the NPN and PNP transistors. Layer 16 forms the base and layer 18 forms the collector above region 12 for the NPN transistor that will operate in the upward direction. Layer 18 forms the base and layer 16 forms the collector above region 14 for the PNP transistor that will operate in the downward direction.

Figure 14:
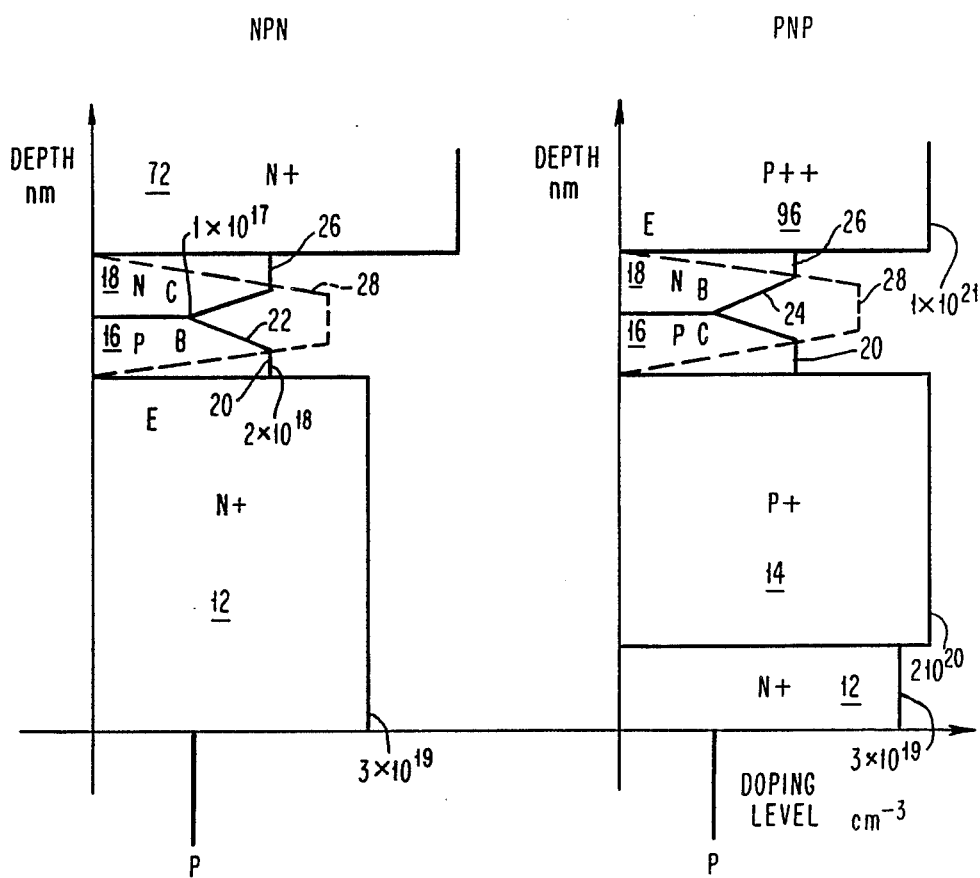
FIG. 14 is an impurity profile plot of the complementary transistor structure of FIG. 8.

The low temperature epitaxial techniques of MBE and LTE allow for the formation of profile gradients in both the upward and downward directions in layers 16 and 18. As can best be seen in FIG. 14, one possible profile gradient for layers 16 and 18 includes a uniform doping profile 20 for one thickness of layer 16 and a graded doping profile 22 for the remaining thickness of layer 16. Layer 18, similarly includes a graded doping profile 24 for one thickness and a uniform doping profile 26 for the remaining thickness. FIG. 14 shows side by side plots for the NPN and PNP transistors. However, it should be understood that FIG. 14 does not show an actual doping profile plot but is intended to represent an approximation of the doping profiles in order to better understand the relationship of the profiles of the various layers to each other. As depicted in FIG. 14, the minimum doping level for layers 16 and 18 is at the junction between the layers. The profiles are shown with identical minimum values of about $1 \times 10^{17} cm^{-3}$ and identical maximum values of about $2 \times 10^{18} cm^{-3}$. Therefore, the intrinsic regions for both the NPN and PNP transistors have the same vertical profile, symmetrical about the junction between the layers, resulting in the transistors having substantially equal performance characteristics. In addition, the symmetry may be enhanced by providing that the thickness of each layer 16 and 18 having the uniform doping profile and the grading doping profile be equal. For example if each layer 16 and 18 is 100 nm thick, each will have a uniform doping for 50 nm and a graded doping for 50 nm. Since only the graded portions on both sides of the base-collector junction are depleted during operation, the flat regions form the quasi-neutral bases. It is preferable to maintain the doping level at the base-collector junction near $1 \times 10^{17} cm^{-3}$, to keep the intrinsic capacitance of the base-collector junction small and to have a high field for short transit time through the depletion layer. By providing a flat profile on the base emitter junction side, better control of the base thickness can be obtained and the neutral base width is still as thin as 50 nm. For the example shown in the figures, the sheet resistance of the PNP and the NPN transistors have been simulated to be 5 and 7 kohms respectively. It will be understood by those skilled in the art that if the total thickness of the layers forming the transistor structure is reduced, the preferred doping level in the neutral base has to be readjusted.

In another embodiment, layers 16 and 18 may be formed by depositing a compound semiconductor material to create a heterojunction transistor. For example, a strained Si-Ge layer of semiconductor material can be deposited for layers 16 and 18. The MBE and LTE processes may be utilized for depositing the compound semiconductor layers. In order to further improve performance, a graded bandgap base can be accomplished by depositing the layers with a graded Ge content. A suggested Ge profile is indicated by the dashed lines 28 in FIG. 14. The NPN transistor performance is especially improved because in the upward direction, all the current is funnelled in the intrinsic region due to the smaller bandgap.

Figure 4:
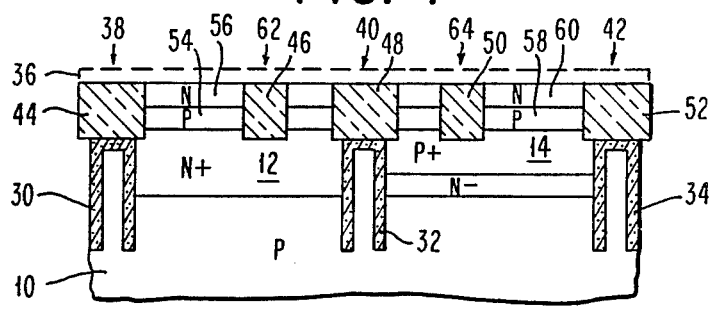

Referring now to FIG. 4, the NPN and PNP devices are isolated by providing deep recessed isolation regions 30, 32 and 34 surrounding the NPN and PNP transistors. The deep recessed isolation regions are formed by a conventional low temperature deep trench process wherein a masking layer such as silicon dioxide and/or silicon nitride 36, shown in phantom, is deposited on the surface of the substrate assembly and windows are etched in regions 38, 40 and 42 in the layer 36. Silicon is etched through the windows 38, 40 and 42 to a depth into the substrate 10 and an insulating material is formed in the etched areas. The insulating material may be formed by thermal oxidation wherein the silicon is oxidized and grows to fill the areas that have been etched away. Alternatively, silicon dioxide or silicon nitride may be deposited by chemical vapor deposition. Thereafter, shallow isolation regions 44, 46, 48, 50 and 52 are formed by a low temperature process to isolate the NPN and PNP intrinsic profiles and to provide space for reach-through contacts. The NPN intrinsic profile is thereby defined as region 54 forming the base and region 56 forming the collector. The PNP intrinsic profile is defined as region 58 forming the collector and region 60 forming the base. The shallow isolation regions are formed by opening additional windows 62 and 64 in the masking layer 36 and depositing oxide in the openings 38, 40, 42, 62 and 64.

Figure 5:
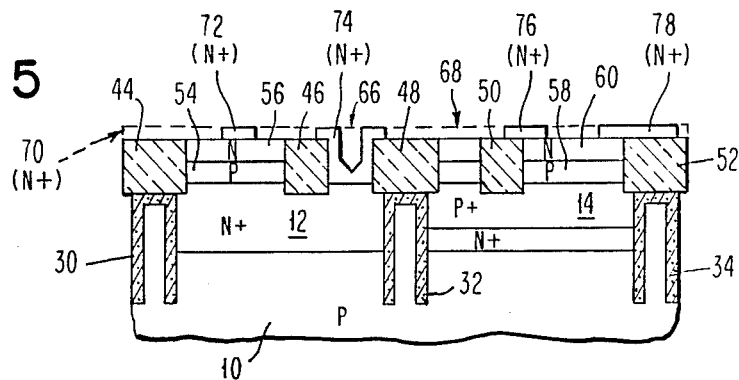

Referring now to FIG. 5, an emitter reach through area 66, defined between isolation regions 46 and 48, for the NPN transistor, is opened by forming a masking layer, not shown, over the surface of the substrate assembly having a window over the emitter reach through area 66 and etching the silicon from layers 16 and 18 to the sub-emitter 12. Although not shown in FIG. 5 as being opened, a collector reach through area 68, defined between isolation regions 48 and 50, for the PNP transistor, may also be opened simultaneously with the opening of area 66. Thereafter, a fourth layer 70 of polycrystalline silicon material, shown in phantom, is deposited on the surface of the substrate assembly. The layer 70 may be deposited by low pressure chemical vapor deposition or MBE and is heavily doped N-type. The N+ polysilicon layer 70 is then patterned and selectively etched to provide an N+ extrinsic collector region 72, an emitter reach through region 74 and a pair of N+ extrinsic base regions 76 and 78. Thus, the regions 72 and 74 for the NPN transistor and the regions 76 and 78 for the PNP transistor are simultaneously formed in one masking and etching process.

Figure 6:
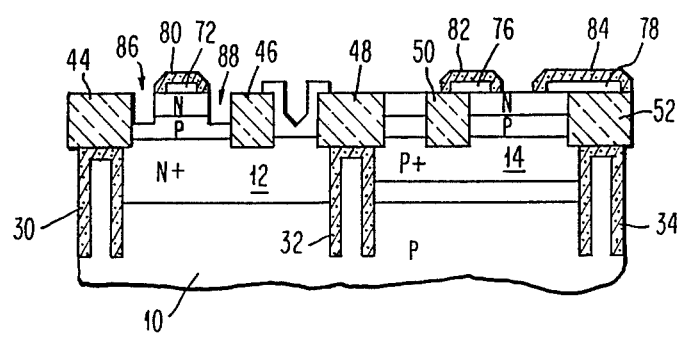

As shown in FIG. 6, the masking layer for forming the polysilicon regions 72, 76 and 78, typically an oxide layer, is maintained and oxide sidewalls are formed by conventional techniques to provide oxide regions 80, 82 and 84 covering the polysilicon regions 72, 76 and 78, respectively. In addition, windows are opened in the masking layer on opposite sides of the oxide/poly stack 72, 80. Silicon in region 56 and a portion of the silicon in region 54 is then etched through the windows 86 and 88.

Figure 7:
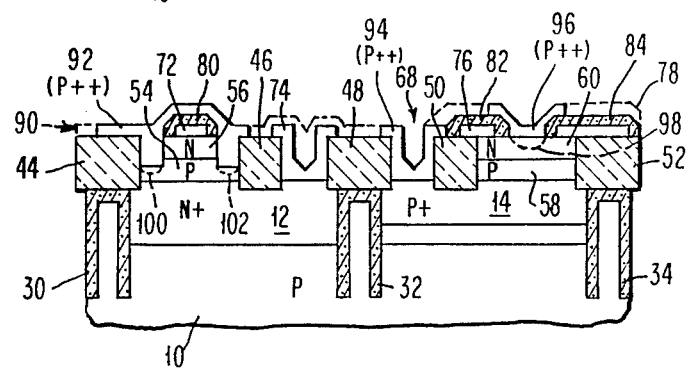

As shown in FIG. 7, a collector reach through region 68 is etched through to region 14 by depositing a masking layer having a window over the region 68. Thereafter, a heavily P-doped conformal layer 90 of single crystal silicon is deposited by LTE or MBE. The layer 90 is thereafter etched through a masking layer to form extrinsic base 92 for the NPN transistor, and to form reach-through region 94 and emitter region 96 of the PNP transistor. A very shallow out diffusion 98 is formed during the deposition of the layer 90 to move the base-emitter junction of the PNP transistor into the intrinsic collector region 60 and out diffusions 100 and 102 are formed in the NPN transistor intrinsic base region 54. In the preferred embodiment, no additional anneal will be provided to maintain an abrupt base emitter junction for the PNP. The base contact holes for the NPN, windows 86 and 88 will reach very close or into the N+ layer 56.

Figure 8:
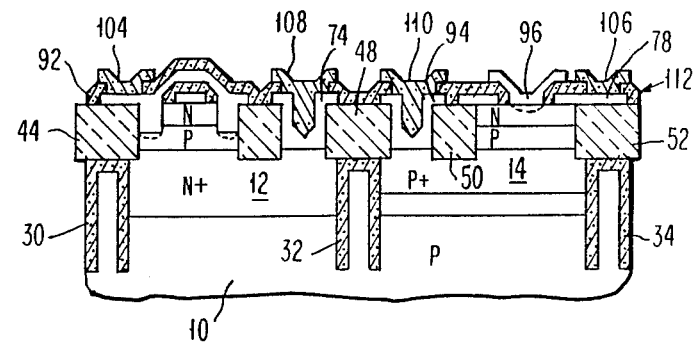

As shown in FIG. 8, base contacts 104 and 106 are formed on the extrinsic base regions 92 and 78 respectively for the NPN and PNP transistors and emitter contact 108 and a collector contact 110 are formed on the reach-through regions 74 and 94, respectively. The contacts are typically deposited in windows of an oxide masking layer 112 deposited on the surface of the structure.

The formation of the emitter 96 for the PNP transistor utilizes a double polysilicon-like process. Preferably, the emitter is formed by ultrahigh vacuum LTE with a very steep, single crystal emitter profile. The LTE emitter has little or no Dt (diffusion coefficient×time) thereby eliminating any adverse affect on the NPN profile. The single crystal quality ensures low emitter resistance and the high doping reduces the base current to acceptable levels. As shown in FIG. 14, the emitter region 96 is highly doped to a level of $1 \times 10^{21} cm^{-3}$.

Figure 9:
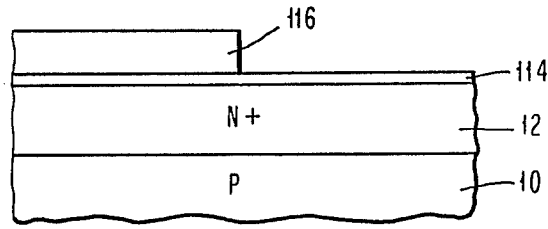
FIGS. 9-13 are cross-sectional views showing various steps employed in forming the sub-collector and sub-emitter regions for each of the complementary pair of transistors.
Figure 10:
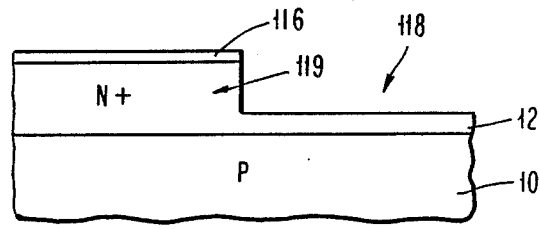
Figure 11:
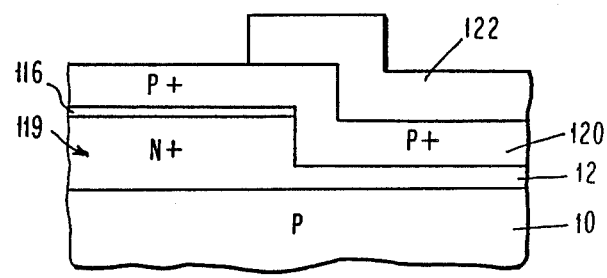
Figure 12:
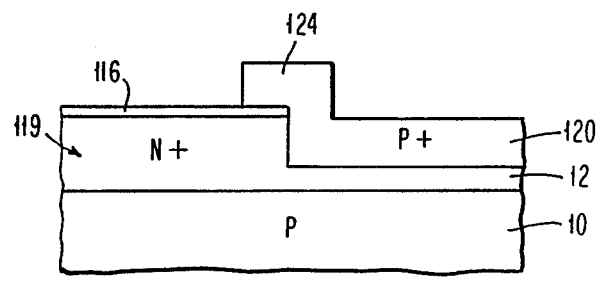
Figure 13:
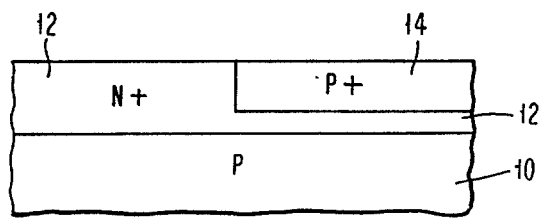

Referring now to FIGS. 9-13, the method for forming the sub-collector region 14 begins with the substrate 10 and the N+ epitaxial layer 12. As shown in FIG. 9, an oxide and/or a nitride layer 114 is deposited on layer 12 and a mask layer 116 is formed on layer 114 having an opening in the region where the sub-collector is to be formed. A shallow trench 118 is then etched through the opening to remove layer 114 to the desired depth in layer 12 as shown in FIG. 10. A mesa-like region 119 of layer 12 remains. As shown in FIG. 11, a blanket layer of heavily P-doped silicon 120 is deposited by LTE using a UHV/CVD system. A mask layer 122 slightly larger than the trench region 118 is formed on layer 120 and the exposed portion of layer 120 is etched leaving a high aspect portion 124 as shown in FIG. 12. The region 124 is removed by chemical-mechanical polishing thereby planarizing the surface to provide the sub-collector region 14 and sub-emitter region 12 on a substrate 10 as shown in FIG. 13, which is the identical structure shown in FIG. 2.

While the invention has been particularly shown and described with respect to preferred embodiments thereof, it will be understood by those skilled in the art that the foregoing and other changes in form and details may be made therein without departing from the spirit and scope of the invention, which should be limited only by the scope of the appended claims.

Having thus described the invention, what is claimed as new and what is desired to be secured by Letters Patent is:

1. A transistor structure including a complementary pair of first and second vertical bipolar transistors on a common semiconductor substrate comprising:
    a first epitaxial layer of semiconductor material of a first conductivity type formed on the surface of a semiconductor substrate of a second conductivity type opposite to said first conductivity type, a sub-emitter region of said first conductivity type for said first transistor being formed in said first layer;
    a sub-collector region of said second conductivity type for said second transistor formed in the first layer;
    a second epitaxial layer of semiconductor material of said second conductivity type formed on the surface of said first layer;
    a third epitaxial layer of semiconductor material of said first conductivity type formed on the surface of said second layer;
    deep recessed isolation regions extending from the surface of said third layer into said substrate, said deep isolation regions surrounding each of said transistors;
    intrinsic base and collector regions of said first transistor formed in said second and third layers respectively and intrinsic collector and base regions of said second transistor formed in said second and third layers respectively;
    shallow recessed isolation regions formed in said second and third layers surrounding said intrinsic base and collector regions;
    a pair of extrinsic base regions of said first conductivity type for said second transistor and an extrinsic collector region of said first conductivity type for said first transistor formed on the surface of said third layer;
    a sub-emitter reach-through region of said first conductivity type formed in said second and third layers;
    an extrinsic base region of said second conductivity type for said first transistor overlying said collector region of said first conductivity type;
    a sub-collector reach-through region of said second conductivity type formed in said second and third layers; and
    an emitter region of said second conductivity type for said second transistor formed overlying said base region of said first conductivity type.

2. The transistor structure of claim 1 wherein said first transistor and said second transistor are NPN and PNP transistors, respectively, and wherein said first and second conductivity type are N-type and P-type conductivity, respectively.

3. The transistor structure of claim 2 wherein said second layer has a uniform vertical doping profile for a first thickness and a graded doping profile for the remaining thickness.

4. The transistor structure of claim 3 wherein said third layer has a graded vertical doping profile for a first thickness and a uniform vertical doping profile for the remaining thickness.

5. The transistor structure of claim 4 wherein said second and third layers are deposited with a uniform doping profile of about $2\times10^{18}$cm$^{-3}$ and a graded doping profile from about $1\times10^{17}$cm$^{-3}$ to $2\times10^{18}$cm$^{-3}$.

6. The transistor structure of claim 5 wherein the doping level of both said second and third layer is about $1\times10^{17}$cm$^{-3}$ at the junction between said second and third layers.

7. The transistor structure of claim 6 wherein said first thickness and said remaining thickness of both said second and third layers are approximately equal.

8. The transistor structure of claim 7 wherein said first thickness and said remaining thickness are approximately 50 nm.

9. The transistor structure of claim 1 wherein said second layer comprises a compound semiconductor material.

10. The transistor structure of claim 9 wherein said third layer comprises a compound semiconductor material.

11. The transistor structure of claim 10 wherein said second and third layers comprise a compound semiconductor of silicon and germanium.

12. The transistor structure of claim 11 wherein said second and third layers have a graded Ge content having a peak at the junction between said second and third layers.

13. The transistor structure of claim 1 wherein said pair of extrinsic base regions of said first conductivity type, said extrinsic collector region and said emitter reach-through region of said first conductivity type are formed in a fourth layer of semiconductor material having a polycrystalline structure.

14. The transistor structure of claim 1 wherein said extrinsic base region, said collector reach-through region and said emitter region of said second conductivity type are formed in a fifth epitaxial layer of semiconductor material having a single crystal structure.

15. The transistor structure of claim 14 wherein the emitter of said second transistor has a steep doping profile.

16. The transistor structure of claim 1 further including a base contact of said second conductivity type for said first transistor and a collector contact of said second conductivity type for said second transistor.

17. The transistor structure of claim 16 further including an emitter contact of said first conductivity type for said first transistor and a base contact of said first conductivity type for said second transistor.

18. A transistor structure including a complementary pair of first and second vertical bipolar transistors on a common semiconductor substrate comprising:
- a first epitaxial layer of semiconductor material of a first conductivity type formed on the surface of a semiconductor substrate of a second conductivity type opposite to said first conductivity type, a sub-emitter region of said first conductivity type for said first complementary transistor being formed in said first layer;
- a sub-collector region of said second conductivity type for said second complementary transistor formed in the first layer;
- a second epitaxial layer of semiconductor material of said second conductivity type formed on the surface of said first layer;
- a third epitaxial layer of semiconductor material of said first conductivity type formed on the surface of said second layer;
- said second and third layers having a doping profile symmetrical about the junction between said second and third layers;
- deep recessed isolation regions extending from the surface of said third layer into said substrate, said deep isolation regions surrounding each of said transistors;
- intrinsic base and collector regions of said first transistor formed in said second and third layers respectively and intrinsic collector and base regions of said second transistor formed in said second and third layers respectively;
- shallow recessed isolation regions formed in said second and third layers surrounding said intrinsic base and collector regions;
- a pair of extrinsic base regions of said first conductivity type for said second transistor and an extrinsic collector region of said first conductivity type for said first transistor formed on the surface of said third layer;
- a sub-emitter reach-through region of said first conductivity type formed in said second and third layers;
- an extrinsic base region of said second conductivity type for said first transistor overlying said collector region of said first conductivity type;
- a sub-collector reach-through region of said second conductivity type formed in said second and third layers; and
- an emitter region of said second conductivity type for said second transistor formed overlying said base region of said first conductivity type.

19. The transistor structure of claim 18 wherein said second layer has a uniform vertical doping profile for a first thickness and a graded doping profile for the remaining thickness, and wherein said third layer has a graded vertical doping profile for a first thickness and a uniform vertical doping profile for the remaining thickness, wherein the minimum doping levels for both said second and third layers is at the junction between said second and third layers.

20. The transistor structure of claim 19 wherein said second and third layers comprise a compound semiconductor material.

21. The transistor structure of claim 20 wherein said second and third layers comprise a compound semiconductor of silicon and germanium.

22. The transistor structure of claim 21 wherein said second and third layers have a graded Ge content having a peak at the junction between said second and third layers.

23. The transistor structure of claim 22 wherein said second and third layers form a base-collector junction respectively for an NPN transistor operating in the upward direction and said second and third layers form a collector-base junction respectively for a PNP transistor operating in the downward direction.

* * * * *